United States Patent [19]
Baker et al.

[11] Patent Number: 5,158,224
[45] Date of Patent: Oct. 27, 1992

[54] SOLDERING MACHINE HAVING A VERTICAL TRANSFER OVEN

[75] Inventors: Jess J. Baker; Alan J. Cable; Michael S. Templeton, all of Simi Valley, Calif.

[73] Assignee: Robotic Process Systems, Inc., Simi Valley, Calif.

[21] Appl. No.: 840,400

[22] Filed: Feb. 24, 1992

[51] Int. Cl.⁵ ............................. B23K 1/00; B23K 3/00
[52] U.S. Cl. ........................................ 228/37; 228/42; 228/47; 219/388; 432/126
[58] Field of Search ............... 228/37, 42, 47, 180.1, 228/219; 432/126, 242; 219/388, 393, 393

[56] References Cited

U.S. PATENT DOCUMENTS

| | | | |
|---|---|---|---|
| 3,517,605 | 6/1970 | Hursch et al. | 219/388 |
| 4,147,432 | 4/1979 | Yamawaki et al. | 432/126 |
| 4,421,481 | 12/1983 | Holz et al. | 432/126 |
| 4,610,391 | 9/1986 | Nowotarski | 228/37 |
| 4,821,947 | 4/1989 | Nowotarski | 228/37 |
| 4,823,680 | 4/1989 | Nowotarski | 432/64 |

OTHER PUBLICATIONS

Technical Paper, Donald A. Elliott & Dr. Laura J. Turbini "Characterizing Residue from Controlled Atmosphere Wavesoldering".
Sigma Wave 6567, The Dover Technologies Company. Optimizing a No-Clean Circuit Board Process Using Nitrogen Inerting of a Conventional Wave Solder Machine, by: Eugene Hanaway, Lawrence Hagerty and Robert Crothers.
Nitrogen Atmosphere Soldering, by Horst Joachim Hartmann, Circuits Assembly, Jan. 1991.
Single-Step Reflow Soldering and Cleaning, by Gene Waldron, Surface Mount Technology, Feb. 1991.
Cover Gas Wavesoldering Systems—Nitrogenius, Overseas Consulting & Sales, Jan. 1990.
No Fluxing, No Cleaning: Inert-Gas Wave Soldering, by G. Schouten, Dover Soltec, Inc., Circuits Manufacturing, Sep. 1989.
Reflow Soldering with Reactive Gases, Airco Industrial Gases, Nov. 1990, Electronic Packaging and Production.
Fluxless Soldering with Nitrogen, by Mark Nowotarski, Union Carbide Industrial Gases Inc., 1990.
Solder Trends, Developments in Gas Technologies for Electronics Soldering Applications, Jan. 1991.
Precision Porous Metals Engineering Guide, Mott Metallurgical Corporation, Farmington, Conn. (203) 677-7311.

*Primary Examiner*—Samuel M. Heinrich
*Attorney, Agent, or Firm*—Kelly, Bauersfeld & Lowry

[57] ABSTRACT

A machine for soldering printed circuit boards and the like includes a housing enclosing an outer process chamber having a soldering station and fluxing station enclosed therein and an inner heating chamber, in combination with input and output transport conveyors on which the circuit boards enter and exit the housing. The heating chamber includes an elevator rack assembly which transports a succession of circuit boards vertically between the input and output conveyors while subjecting the circuit boards to controlled heating. The heating chamber may also be supplied with an inert or reducing gas to facilitate or eliminate fluxing requirements. The environment within the housing is maintained by air lock doors.

21 Claims, 3 Drawing Sheets

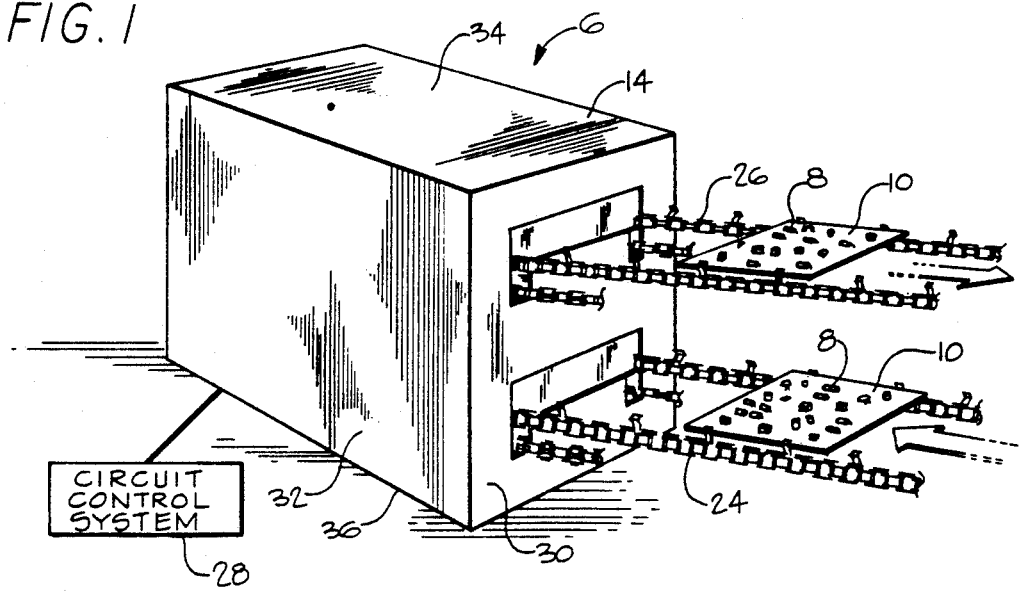
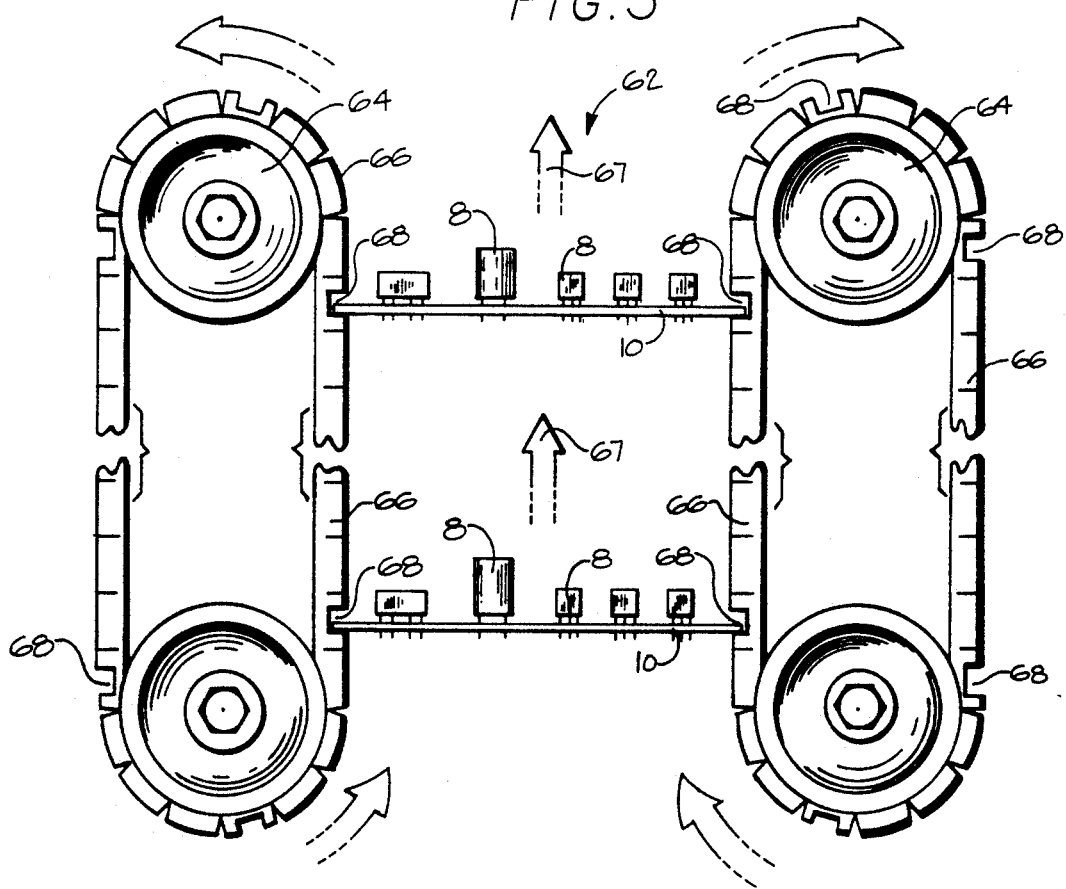

SOLDERING MACHINE HAVING A VERTICAL TRANSFER OVEN

FIELD OF THE INVENTION

This invention relates generally to an improved machine for soldering electronic components to circuit boards to produce electronic subassemblies. More specifically, this invention relates to an improved soldering machine having a vertical transfer oven designed for controlled heating of the circuit boards and components prior to soldering thereby eliminating or minimizing risk of thermal damage to the boards and the components.

BACKGROUND OF THE INVENTION

Printed circuit boards are widely used in modern electronic devices, wherein the circuit board typically comprises a substrate formed from an insulative material with conductive film applied thereto in a prescribed pattern or trace to provide conductive connections between electronic components, such as solid state chips, resistors, capacitors, etc. In this regard, the electronic components commonly include metal prongs adapted for reception into holes formed in the circuit board. The metal prongs are then attached to the circuit board by a soldering process which concurrently connects the components electrically to the conductive film on the board. This soldering step has been achieved by so-called wave soldering wherein the circuit board is conveyed over a standing wave of molten solder material to wet the metal prongs of the electronic components which protrude downwardly through the board. Alternatively, a so-called reflow solder process has been used wherein a solder-based paste is applied to the metal prongs of the electronic components mounted on the board and thereafter the resultant assembly is subjected to sufficient heat to reflow the solder to form the desired electrical connection.

In the past, according to a conventional wave-soldering process, circuit boards with unsoldered components in place are transported on a conveyor in succession to in-line fluxing, heating, and soldering stations. At the heating station, the circuit board is typically heated to approximately 100° C. to activate and dry a flux material for purposes of cleaning each solder site by driving off volatiles which might spatter or otherwise interfere with the soldering step. Heating also minimizes thermal shock to the board during exposure of the board to a molten solder wave. Heating can also assist the solder flow into small holes in the circuit board, particularly such as multilayer circuit boards. If heating is not properly controlled, the risk of thermal damage to the board is increased (for example, cracks in the board may result) and reliability of the components can be reduced.

Control of the heating stage in a typical wave solder machine is often difficult. Such a machine operates typically with straight line conveyors which may be slightly inclined when passing over a molten solder wave, and which typically operate at the same speed regardless of different circuit board thickness and size. If more heating is required, as is especially the case with modern larger and thicker circuit boards, a requisite increased heat input is applied quickly to both the top and bottom sides of the board. In addition to being potentially damaging to the board and components, the heat distribution is often uneven causing problems upon contact with the solder wave.

Attempts have been made to address these heating problems by increasing conveyor lengths and correspondingly enlarging the heating station, or by slowing down the entire soldering process to accommodate longer residence times in the heating stage. Unfortunately, lengthened conveyors and enlarged heating stations occupy more floor space, which is often at a premium in manufacturing facilities. By contrast, slower conveyor speeds result in reduced solder production rates and correspondingly increased per unit cost.

The flux station in a solder process has also been the subject of considerable design focus, especially with respect to attempts to reduce or eliminate the need for typically toxic flux materials. In this regard, the flux material is normally applied to a solder site to remove oxide residue which can interfere with a reliable solder joint. Fluxes have been especially important in advance of heating stage, since oxidation tends to be enhanced in the presence of heat. However, it has been shown that if soldering takes place in an essentially oxygen-free cover-gas atmosphere (instead of in an air atmosphere as is usually the case today), the use of fluxing agents is minimized or eliminated. This process is known as inert-gas soldering. See, e.g., G. Schouten, No Fluxing, No Cleaning: Inert-Gas Wave Soldering, *Circuits Manufacturing*, September 1989. With this process, the molten solder and the solder joints no longer need to be protected against oxidation. Soldering becomes cleaner producing considerably less flux residue, if any, making post-solder solvent cleaning unnecessary. Soldering also becomes more reliable because the resultant oxide-free molten solder leads to fewer faulty joints with commensurate reduction in solder use and waste.

Accordingly, there has been a need for an improved soldering machine that has a heating station designed to provide and maintain an even heat distribution at selected maximum temperature, without requiring increased floor space or reduced process rates in a manufacturing facility. Moreover, there has existed a need for such an improved machine which is also designed to perform solder process steps in an essentially inert atmosphere, whereby the use of flux may be virtually eliminated. The present invention fulfills these needs and provides other related advantages.

SUMMARY OF THE INVENTION

The present invention resides in an improved soldering machine having a vertical transfer oven for controlled heating of the circuit board and electronic components prior to soldering. An inert gas atmosphere may be maintained in some or all of the machine.

The machine comprises, generally, a transfer oven comprising housing means defining an internal heating chamber, and an outer process chamber enclosing an optional fluxing station and a soldering station. Input and output transport conveyors loaded with circuit boards having unsoldered components in place enter and exit the internal heating chamber for respectively delivering the boards to and removing the boards from the transfer oven. The process stations in the outer process chamber function cooperatively with the vertical transfer oven to provide a compact solder machine.

In a preferred form of the invention, the machine is provided for soldering circuit boards after controlled heating in the vertical transfer oven with little or no thermal damage to the boards and components thereon. The housing means has a rectangular box shape defining a front plate having lower and upper openings in vertically spaced relation to each other. The internal heating chamber is defined in part by a divider wall within the housing means and also having lower and upper openings in vertically spaced relation to each other which are generally aligned with the openings in the housing means front plate. The input and output transport conveyors respectively enter and exit via these lower and upper openings. Air lock doors are provided to open and close the openings in the housing front plate and the internal divider wall to permit appropriate entrance and exit passage of the circuit boards.

The transfer oven within the internal heating chamber comprises an adjustable open support frame having an elevator rack assembly mounted within the support frame. This elevator rack assembly includes a pair of transversely spaced, vertically extending drive belts mounted on pulley wheels for rotation in parallel relation to each other, and in opposite directions at the same speed. Horizontally aligned shelf segments on the belts are adapted to receive a succession of circuit boards from the input conveyor for transport vertically between the input and output conveyors while subjecting the circuit boards to controlled heating. A push bar advances and retracts along a lead screw and functions to push the heated boards from the shelf segments one at a time onto the output conveyor for travel to the soldering station.

If an inert environment is desired to minimize or eliminate the use of fluxing agents, the heating chamber may be connected to a continuous source of nonoxidizing or reducing gas. The gas circulates continuously throughout the heating chamber and creates the inert controlled environment by displacing the existing oxygen. The air lock doors maintain stability of the inert environment.

Other features and advantages of the present invention will become apparent from the following more detailed description, taken in conjunction with the accompanying drawings which illustrate, by way of example, the principles of the invention.

BRIEF DESCRIPTION OF THE DRAWINGS

The accompanying drawings illustrate the invention. In such drawings:

FIG. 1, is a perspective view of a soldering machine embodying the novel features of the invention;

FIG. 3 is a vertical sectional view, somewhat in schematic form, showing an elevator rack assembly.

DETAILED DESCRIPTION OF THE PREFERRED EMBODIMENTS

Figure 2:
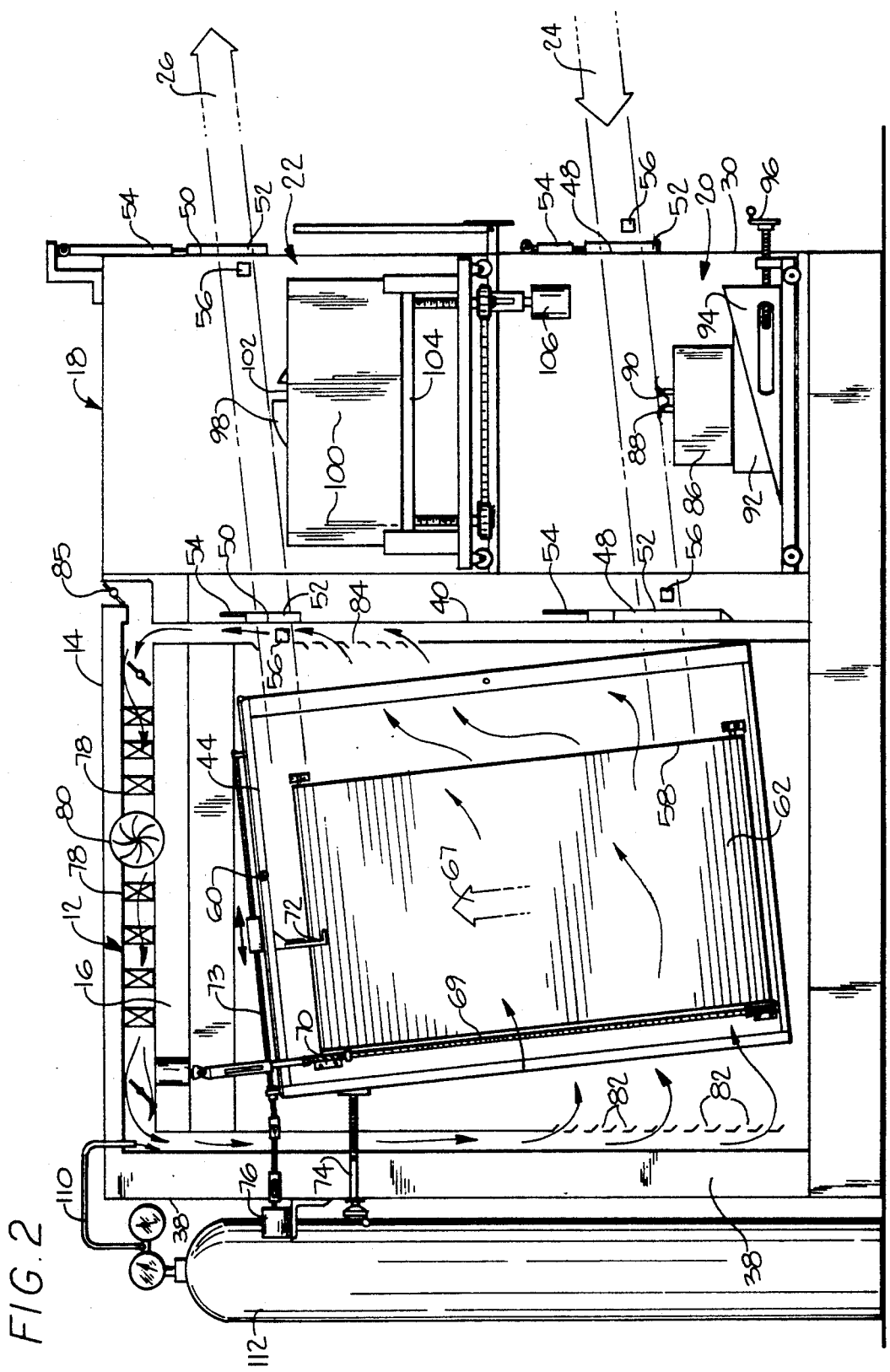
FIG. 2 is a side elevation view of the machine shown in FIG. 1, with a portion of an external housing removed to illustrate internal components.

As shown in the drawings for purposes of illustration, an improved space-saving soldering machine referred to generally in FIG. 1 by the reference number 6 is provided for forming solder joints between electronic components 8 and circuit traces on a circuit board 10, with controlled heating of the circuit boards in a vertical transfer oven 12 (FIG. 2) prior to forming of said solder joints. Controlled heating minimizes thermal damage and shock to the board and components, resulting in an improved soldered product. A nonoxidizing gas atmosphere may be maintained in the machine.

In accordance with the present invention, and as illustrated with respect to a preferred embodiment in FIGS. 1-3, the soldering machine 6 generally comprises the transfer oven 12 comprising a housing 14 defining an internal heating chamber 16, and an outer process chamber 18 enclosing a fluxing station 20 and a soldering 22 station. Separate input and output transport conveyors 24 and 26 carry the circuit boards 10 for respective entrance into and exit from the internal heating chamber 16 whereat the boards are subjected to controlled heating. A circuit control system 28 (FIG. 1) provides coordinated control of machine operation.

The housing 14 is shown having a rectangular box shape which is defined by a generally planar front plate or panel 30. The front plate 30 is connected to a pair of side walls 32 and to a pair of top and bottom end walls 34 and 36 which are in turn connected to a back plate 38. The internal heating chamber 16 occupies a back or rear portion of the housing 14, behind the outer process chamber 18. More particularly, an internal divider wall or panel 40 mounted within the housing 14 subdivides the housing interior into the forward or outer process chamber 18 and the rear or inner heating chamber 16.

As illustrated in FIGS. 1 and 2, the housing front plate 30 and internal divider wall 40 each define lower and upper rectangular openings 48 and 50 in vertically spaced relation to each other. The openings in the housing front plate 30 are generally aligned with the corresponding openings in the internal divider wall 40. The openings are each selectively and substantially closed by an air lock door 52 adapted to slide back and forth within appropriate tracks to expose and cover the openings, respectively. The input 24 conveyor is shown to extend from the housing and heating chamber through the lower openings 48, whereas the output conveyor 20 is shown to extend from the housing 14 and heating chamber 16 through the upper openings 50. For convenience of description, the covered openings on the housing front plate 30 are referred to as external entrance and exit air locks, and the covered openings on the internal divider plate 40 are referred to as internal entrance and exit air locks. Each air lock includes an actuator 54 for positioning the associated sliding door 52, and an optical sensor 56 to signal the circuit control system 28 to open and close the door in response to the presence or absence of a circuit board on the adjacent conveyor.

An oven support frame 58 is mounted within the internal heating chamber 16, as shown in FIG. 2. The support frame 58 comprises a generally box-shaped skeletal structure which is oriented at an angle to correspond with an inclination angle of the conveyors 24 and 26. In this regard, when the solder station 22 comprises a wave-type station as will be described in more detail, the conveyor 26 is commonly oriented to carry the circuit boards over the solder station along a path inclined at about 5°. The frame 28 is oriented to match this inclination angle, and the input conveyor 24 is desirably oriented in parallel with the output conveyer 26. The support frame 58 is conveniently suspended within the heating chamber 16 on a transverse pivot 60 to permit the specific frame angle to be adjusted, as by means of a manually operable adjustment screw 74 connected between the frame 58 and the rear housing wall 38.

An elevator rack assembly 62 as shown in FIGS. 2 and 3 is mounted on and within the support frame 58 and includes dual pairs of pulley wheels 64 having a corresponding pair of drive belts in parallel and transversely spaced relation to each other. The pairs of pulley wheels associated with the two drive belts are adapted to turn in opposite directions at the same speed, thereby displacing the facing surfaces of the drive belts vertically upwardly in unison, as indicated by arrow 67. A drive motor 65 within an upper portion of the housing 14 rotates a drive shaft 69 for rotatably driving the pulley wheels 64, as by means of a worm gear drive connection 70 or the like.

The elevator rack assembly 62 transports a succession of the circuit boards 10 vertically between the input and output conveyors 24 and 26 while subjecting the boards 10 to controlled heating. More particularly, the belts 66 define transversely aligned pairs of recessed shelf segments 68 (FIG. 3). The boards 10 with unsoldered components 8 thereon are delivered one at a time, in timed relation, by the input conveyor 24 to extend horizontally between an aligned pair of shelf segments 68. As the belts 66 are driven, a succession of the circuit boards in vertically spaced array are transported vertically up the elevator rack assembly 62. A push bar 72 which extends into the top of the frame 58 advances and retracts along a lead screw 73 in response to controlled operation of a push bar motor 76, to push the heated board from the uppermost shelf onto the output conveyor 26 for travel to the soldering station 22.

The internal heating chamber 16 includes a forced convection heater system having a plurality of heating elements 78 and a fan 80 for circulating the heat throughout the chamber. Heated gas flows through inlet and outlet vents 82 and 84, and an exhaust vent 85 equipped with a relief valve may be provided to prevent chamber overheating. The heating elements and fan are mounted inside the heating chamber in a ceiling overhead plenum. In operation, the heating system is designed to raise the temperature of the boards to be soldered to a selected optimum temperature, typically about 100° C. This heating arrangement provides for substantially uniform heating of a plurality of boards on the elevator rack assembly 62, with a residence time for each board within the heating chamber being substantially independent of conveyor size or length.

The outer process chamber 18 occupies the front or forward portion of the housing 14, although it will be recognized that the outer process chamber 18 may be outside the housing entirely. The illustrative fluxing station 20 is located proximate the housing entrance and inside a lower portion of the outer process chamber 18. The fluxing station 20 includes fluxing material contained within a flux pot 86. The fluxing material passes up through a wick 88 and is applied by brushes 90 to the underside of the circuit board. The flux pot 86 is conveniently mounted on a ramped block 92 which can be positionally adjusted on a ramped base 94 by a lead screw adjustment mechanism 96 or the like to accommodate differing input transport conveyor heights.

In use, populated circuit boards (circuit boards with components in place but not soldered) are placed onto the input conveyor 24. The input conveyor and circuit boards thereon enter the housing 14 through the external entrance air lock in the front plate 30 of the housing 14. After entering the housing 14, the circuit boards 10 are passed over the flux (if used) which wets the board and component surfaces. At the appropriate moment, in response to operation of the control circuit 28, the internal entrance air lock opens and the fluxed board is delivered onto the appropriate shelf segments 68 in the elevator rack assembly 62. This process is repeated continuously or incrementally to deliver the boards one at a time to the elevator rack assembly. The belts 66 of the elevator rack assembly 62 transport the boards continuously or incrementally until the boards have reached the height of the push bar 72. At the appropriate time as determined by the circuit control system 28, the internal exit air lock opens and the push bar 72 pushes the heated circuit board onto the output conveyor 26. The door closes and the push bar 72 is retracted to its original position. Meanwhile, the heated board on the output conveyor 26 proceeds to the soldering station 22. As soldering is completed, the external exit air lock opens and the soldered board exits the housing 14.

In one preferred embodiment as illustrated in FIGS. 1-3, the soldering station 22 positioned inside the outer process chamber 18 comprises a wave solder station generally conforming to that shown and described in U.S. Pat. No. 4,610,391, which is incorporated by reference herein. Briefly, a standing solder wave 98 is formed by pumping molten solder, contained within a solder pot 100, up through a nozzle 102 and over a weir to provide the standing wave 98. The solder pot 100 is fixed on a support block 104 which can be raised or lowered by means of a lead screw adjustment mechanism 106 to accommodate the specific dimensional parameters of the boards being processed.

Figure 4:
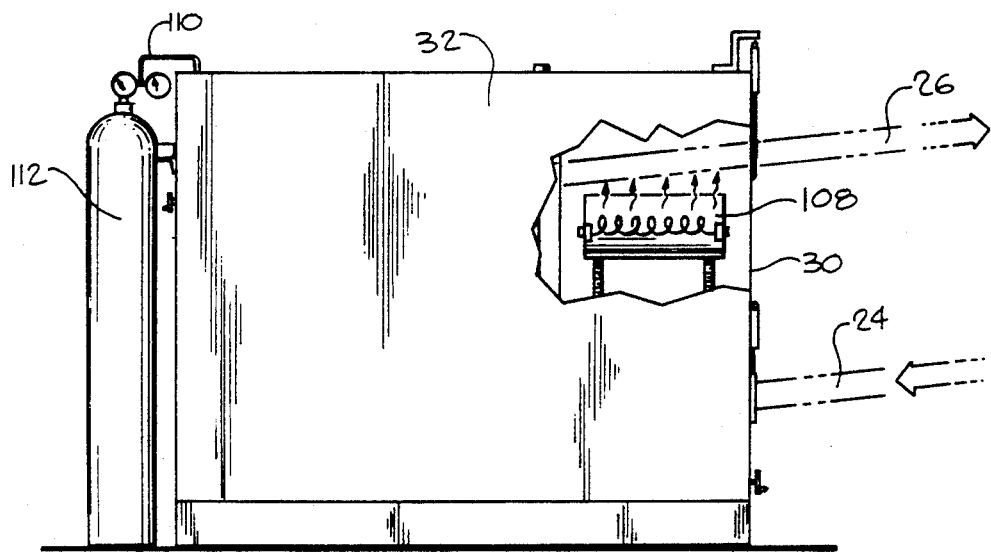
FIG. 4 is a side view illustrating an alternative preferred form of the invention, with a portion broken away to illustrate a reflow solder station.

In a second illustrated embodiment shown in FIG. 4, the soldering station comprises an infrared heater 108 for use when reflow soldering is required. When the output conveyor 26 passes over the infrared heater 108, solder paste that has been applied previously to the circuit board "reflows" to form the appropriate soldered terminals. The paste can be applied to the board within the housing or elsewhere.

The operation of both the wave and reflow solder machines is controlled by the circuit control system 28. Timing of the different sequential processes is performed using information from the sensors 56 placed to monitor the transport conveyors 24 and 26. The circuit board is passed over to the next station only if it is free to accept the circuit board. The control system may also control the following process features:

1. Temperature of the solder pot;
2. Height of the solder wave;
3. Angle of the conveyors over both the flux and solder stations;
4. Process sequence timing (production rate);
5. Flow or volume of gas within the heating chamber;
6. Purity of gas (measuring % of oxygen);
7. The necessary interlocks and safety features;
8. Statistical process control;
9. The ability to program all the above parameters specific to a given product type, wherein the program can be stored in memory for recall when a particular product is processed at a future date.

In accordance with a further aspect of the invention, the heating chamber 16 is particularly adapted to heat the circuit boards 10 in an inert or substantially oxygen free environment, thereby reducing or eliminating need for the flux station 20.

In order to create the inert environment, the heating chamber 16 and/or housing 14 may be connected by means of a conduit 110 to a continuous source of inert or reducing gas 112, such as nitrogen, argon, hydrogen, and mixtures thereof. As illustrated in FIG. 2, the gas enters the heating chamber 16 for delivery to the recirculation system as previously described. The gas fills the heating chamber 16 and/or housing 14, and thus creates an inert controlled atmosphere by displacing the existing oxygen. The air lock doors 52 maintain the stability of the inert atmosphere, with a sufficient positive pressure being maintained in the heating chamber and/or housing so that there is substantially no oxygen inflow.

When an inert or reducing gas is used in wave soldering, the solder wave 98 within the process chamber 18 beneficially circulates in the cover-gas atmosphere and is thus protected against oxidation that would otherwise in the presence of oxygen. This use of an inert atmosphere in a wave or reflow solder process has also been found to provide a significant improvement in solder joint quality.

Although a particular embodiment of the invention has been described in detail for purposes of illustration, various modifications may be made without departing from the spirit and scope of the invention. Accordingly, the invention is not be be limited, except as by the appended claims.

We claim:

1. A transfer oven for use in heating and transferring electronic subassemblies in a soldering system, comprising:
    housing means defining an internal heating chamber;
    means for controlling the temperature level within said heating chamber;
    an elevator assembly mounted within said heating chamber and including means for supporting a plurality of electronic subassemblies in vertically spaced relation, and for transporting the electronic subassemblies in succession in a generally vertical direction between upper and lower ends of the elevator assembly;
    input conveyor means for loading the electronic subassemblies in succession onto the elevator assembly at one of the upper and lower ends thereof; and
    output conveyor means for unloading the electronic subassemblies in succession from the elevator assembly at the other of the upper and lower ends thereof.

2. The transfer oven of claim 1 wherein said housing means defines a front panel having a pair of vertically spaced openings formed therein, and a pair of air lock doors movably mounted on said openings for movement between open and substantially closed positions respectively permitting and preventing access to said heating chamber.

3. The transfer oven of claim 1 further including means for supplying a nonoxidizing gas to said housing means to displace oxygen therein.

4. The transfer oven of claim 1 wherein said input and output conveyor means are inclined.

5. The transfer oven of claim 4 wherein said elevator assembly is mounted at an incline corresponding generally with the inclination of said conveyor means, and further including means for adjusting the inclination angle of said elevator assembly.

6. The transfer oven of claim 1 wherein said elevator assembly comprises a pair of pulley wheel sets each having a drive belt wrapped thereon, said drive belts being transversely spaced and extending generally vertically and having aligned pair of shelf segments for supporting the electronic subassemblies in vertically spaced relation, and means for driving said pulley wheel sets to rotate said belts thereon in opposite directions at the same speed to transport said electronic subassemblies vertically between the input and output conveyor means.

7. The transfer oven of claim 1 wherein said output conveyor means defines an output conveyor for transporting electronic subassemblies from the elevator assembly and push bar means for unloading the electronic subassemblies in succession from said elevator assembly onto the output conveyor.

8. The transfer oven of claim 1 wherein said housing means further defines a process chamber having a solder station therein, said output conveyor means transporting the electronic subassemblies from said elevator assembly to said solder station.

9. The transfer oven of claim 8 wherein said process chamber further includes a fluxing station with means to apply flux to said electronic subassemblies, said input conveyor means transporting the electronic subassemblies from said fluxing station to said elevator assembly.

10. The transfer oven of claim 8 wherein said solder station is a reflow soldering station.

11. The transfer oven of claim 8 wherein said solder station is a wave soldering station.

12. A soldering machine comprising:
    a housing having an internal divider wall separating the housing interior into an outer process chamber and an internal heating chamber, said housing having a front panel with an entrance opening and an exit opening formed therein to permit respective entrance and exit conveyance of electronic subassemblies between the exterior of said housing and said process chamber, and said divider wall having an entrance and exit formed therein to permit respective entrance and exit conveyance of the electronic subassemblies between the process chamber and said heating chamber;
    air lock door means for movement between open and closed positions respectively permitting and preventing passage of the electronic subassemblies through entrance and exit openings;
    input and output conveyor means for respectively transporting the electronic subassemblies through said entrance openings to said heating chamber, and through said exit openings for passage to the exterior of said housing;
    means for maintaining a controlled elevated temperature within said heating chamber; and
    means for transferring the electronic subassemblies in succession within said heating chamber from said input conveyor means to said output conveyor means.

13. The soldering machine of claim 12 wherein each of said pair of entrance and exit openings are vertically spaced.

14. The soldering machine of claim 12 further including means for supplying a nonoxidizing gas to said housing to displace oxygen therein.

15. The soldering machine of claim 12 wherein said input and output conveyor means are inclined.

16. The soldering machine of claim 12 wherein said transferring means comprises an elevator assembly mounted within said heating chamber.

17. The soldering machine of claim 16 wherein said elevator assembly is mounted at an incline corresponding generally with the inclination of said conveyor means, and further including means for adjusting the inclination angle of said elevator assembly.

18. The soldering machine of claim 17 wherein said elevator assembly comprises a pair of pulley wheel sets each having a drive belt wrapped thereon, said drive belts being transversely spaced and extending generally vertically and having aligned pair of shelf segments for supporting the electronic subassemblies in vertically spaced relation, and means for driving said wheel sets to rotate said belts thereon in opposite directions at the same speed to transport said electronic subassemblies vertically between the input and output conveyor means.

19. The transfer oven of claim 17 wherein said output conveyor means defines an output conveyor for transporting electronic subassemblies from the elevator assembly and push bar means for unloading the electronic subassemblies in succession from said elevator assembly onto the output conveyor.

20. The soldering machine of claim 16 further including a solder station within said process chamber, said output conveyor means transporting the electronic subassemblies from said heating chamber to said solder station.

21. The soldering machine of claim 20 wherein said process chamber further includes a fluxing station with means to apply flux to said electronic subassemblies said input conveyor means transporting the electronic subassemblies from said fluxing station to said elevator assembly.

* * * * *